United States Patent
Chan et al.

(10) Patent No.: US 7,049,819 B2
(45) Date of Patent: May 23, 2006

(54) DIAGONAL-ARRANGED QUADRATURE MRI RADIO FREQUENCY ARRAY COIL SYSTEM FOR THREE DIMENSIONAL PARALLEL IMAGING

(75) Inventors: Pei Hsuon Chan, Aurora, OH (US); Mark Xueming Zou, Mantua, OH (US)

(73) Assignee: General Electric Company, Schenectady, NY (US)

( * ) Notice: Subject to any disclaimer, the term of this patent is extended or adjusted under 35 U.S.C. 154(b) by 41 days.

(21) Appl. No.: 10/761,043

(22) Filed: Jan. 20, 2004

(65) Prior Publication Data

US 2004/0183534 A1    Sep. 23, 2004

Related U.S. Application Data

(60) Provisional application No. 60/441,359, filed on Jan. 21, 2003.

(51) Int. Cl.
*G01V 3/00* (2006.01)
(52) U.S. Cl. ........................ 324/319; 324/318
(58) Field of Classification Search ................ 324/318, 324/322, 309, 307, 319, 300; 600/410
See application file for complete search history.

(56) References Cited

U.S. PATENT DOCUMENTS

| | | | |
|---|---|---|---|
| 4,692,705 A | | 9/1987 | Hayes |
| 4,767,993 A | * | 8/1988 | Hanawa ...................... 324/318 |
| 4,825,162 A | | 4/1989 | Roemer et al. |
| 5,185,577 A | * | 2/1993 | Minemura ................... 324/318 |
| 5,370,118 A | | 12/1994 | Vij et al. |
| 5,394,087 A | * | 2/1995 | Molyneaux .................. 324/318 |
| 5,477,146 A | | 12/1995 | Jones |
| 5,530,355 A | | 6/1996 | Doty |
| 5,543,711 A | | 8/1996 | Srinivasan et al. |
| 5,548,218 A | | 8/1996 | Lu |
| 5,682,098 A | * | 10/1997 | Vij ............................. 324/318 |
| 6,223,065 B1 | | 4/2001 | Misic et al. |
| 6,300,761 B1 | * | 10/2001 | Hagen et al. ................ 324/318 |
| 6,377,044 B1 | * | 4/2002 | Burl et al. ................... 324/307 |
| 6,438,402 B1 | * | 8/2002 | Hashoian et al. ........... 600/410 |
| 6,492,814 B1 | | 12/2002 | Watkins et al. |
| 6,498,489 B1 | | 12/2002 | Vij |
| 6,836,117 B1 | * | 12/2004 | Tamura et al. .............. 324/318 |
| 6,836,118 B1 | * | 12/2004 | Molyneaux et al. ........ 324/319 |
| 6,894,496 B1 | * | 5/2005 | Molyneaux et al. ........ 324/318 |
| 2004/0061498 A1 | * | 4/2004 | Ochi et al. .................. 324/318 |

OTHER PUBLICATIONS

"SENSE: Sensitivity Encoding for Fast MRI", Pruessman, et al., Magnetic Resonance in Medicine, vol. 42, p952-p962 (1999).
"Synergy Body Coil Optimal Design for SENSE Imaging". P.C.H.A. Haans, ISMRM 8th Annual Meeting, p557 (2000). (CDROM).
"An array that exploits phase for SENSE Imaging", Hajnal, et al., ISMRM 8th Annual Meeting, p1719 (2000).

(Continued)

*Primary Examiner*—Brij B. Shrivastav
(74) *Attorney, Agent, or Firm*—Carl B. Horton, Esq.; Armstrong Teasdale LLP

(57) ABSTRACT

A coil and method for a medical imaging are provided. The coil includes a first section and a second section. The first and second sections form a loop and are configured in a diagonal arrangement.

22 Claims, 17 Drawing Sheets

OTHER PUBLICATIONS

"Specific Coil Design for SENSE: A Six-Element Cardiac Array", Weiger, et al., Magnetic Resonance in Medicine, vol. 45, p495-p504 (2001).

"Concentric Coil Arrays for Spatial Encoding in Parallel MRI", Ohlinger, et al., ISMRM 9th Annual Meeting, p21 (2001).

"Torso Array Coil with Eight QD-Surface Coils for Parallel Imaging", Okamoto, et al., ISMRM 10th Annual Meeting, p859 (2002). (CDROM).

"An 8 Channel Cardiac SENSE Array", Klinge, et al., ISMRM 10th Annual Meeting, p904 (2002). (CDROM).

* cited by examiner

DIAGONAL-ARRANGED QUADRATURE MRI RADIO FREQUENCY ARRAY COIL SYSTEM FOR THREE DIMENSIONAL PARALLEL IMAGING

CROSS REFERENCE TO RELATED APPLICATIONS

This application claims priority to and the benefit of the filing date of U.S. Provisional Application No. 60/441,359, filed on Jan. 21, 2003 and which is hereby incorporated by reference in its entirety.

BACKGROUND OF THE INVENTION

This invention relates generally to magnetic resonance imaging (MRI) systems and, more particularly, to radio-frequency (RF) coils in such systems.

Magnetic Resonance Imaging (MRI) utilizes hydrogen nuclear spins of the water molecules in the human body, which are polarized by a strong, uniform, static magnetic field of a magnet (typically denoted as $B_0$—the main magnetic field in MRI physics). The magnetically polarized nuclear spins generate magnetic moments in the human body. The magnetic moments point in the direction of the main magnetic field in a steady state and produce no useful information if they are not disturbed by any excitation.

The generation of nuclear magnetic resonance (NMR) signals for MRI data acquisition is accomplished by exciting the magnetic moments with a uniform radio-frequency (RF) magnetic field (typically referred to as the $B_1$ field or the excitation field). The $B_1$ field is produced in the imaging region of interest by an RF transmit coil that is driven by a computer-controlled RF transmitter with a power amplifier. During excitation, the nuclear spin system absorbs magnetic energy, and it's magnetic moments precess around the direction of the main magnetic field. After excitation, the precessing magnetic moments will go through a process of free induction decay (FID), releasing their absorbed energy and returning to a steady state. During FID, NMR signals are detected by the use of a receive RF coil that is placed in the vicinity of the excited volume of the human body. The NMR signal is the secondary electrical voltage (or current) in the receive RF coil that has been induced by the precessing magnetic moments of the human tissue. The receive RF coil can be either the transmit coil itself or an independent receive-only RF coil. The NMR signal is used for producing MR images by using additional pulsed magnetic gradient fields that are generated by gradient coils integrated inside the main magnet system. The gradient fields are used to spatially encode the signals and selectively excite a specific volume of the human body. There are usually three sets of gradient coils in a standard MRI system that generate magnetic fields in the same direction of the main magnetic field and varying linearly in the imaging volume.

In MRI, it is desirable for the excitation and reception to be spatially uniform in the imaging volume for better image uniformity. In a standard MRI system, the best excitation field homogeneity is usually obtained by using a "whole-body" volume RF coil for transmission. The "whole-body" transmit coil is the largest RF coil in the system. A large coil, however, produces lower signal-to-noise ratio (SNR or S/N) if it is also used for reception, mainly because of its greater distance from the signal-generating tissues being imaged. Because a high signal-to-noise ratio is the most desirable in MRI, special-purpose coils are used for reception to enhance the S/N ratio from the volume of interest.

In practice, it is desirable for a well-designed specialty RF coil to have the following functional properties: high S/N ratio, good uniformity, high unloaded quality factor (Q) of the resonance circuit, and high ratio of the unloaded to loaded Q factors. In addition, the coil device must be mechanically designed to facilitate patient handling and comfort, and to provide a protective barrier between the patient and the RF electronics. Another way to increase the SNR is by quadrature reception. In this method, NMR signals are detected in two orthogonal directions, which are in the transverse plane or perpendicular to the main magnetic field. The two signals are detected by two independent individual coils that cover the same volume of interest. With quadrature reception, the SNR can be increased, for example, by up to $\sqrt{2}$, over that of the individual linear coils.

A sensitivity encoding (SENSE) technique allows for reducing imaging time by increasing imaging speed. Using the SENSE technique, the spatial sensitivity information in the imaging space (i.e., the real space) provided by the coil elements of a multiple-coil array system can be used to substitute for the information provided by the encoding gradient in the k-space. By skipping some k-space lines, therefore saving imaging time, and using the spatial sensitivity information provided by each of the coil elements, an artifact-free full field of view (FOV) image may still be reconstructed. For example, by eliminating two-thirds of the k-space lines (i.e., by tripling the distance between two adjacent k-space lines), the imaging time can be reduced by about two-thirds. Tripling the distance between two adjacent k-space lines results in a reduction of the FOV in the imaging space to one-third of its original full FOV size. Therefore, the image intensity of each pixel inside the reduced FOV image will be the superposition of the image intensity of three pixels at three different locations in the full FOV image. Knowing the spatial sensitivity profile of each coil element of a multiple-coil array system (at least three coil elements are needed in this case) in the full FOV image and how the reduced FOV image is formed, the superimposed intensities can be separated for each pixel inside the reduced FOV image by solving a set of linear equations. Transferring the separated intensities of the three pixels back to their original locations and performing the same procedures for all the pixels inside the reduced FOV image, the original full FOV image can be reconstructed.

In MRI, a torso RF coil is typically used to image the human torso region, for example, from the top of the liver to the iliac crest or the pelvic region and from the iliac crest to the pubic symphysis. Abdominal and pelvic imaging requires a torso coil to be able to provide good image uniformity in the axial direction (i.e., the transverse direction) as well as good SNR. Non-uniform images caused by the inhomogeneous signal sensitivity profile of a RF coil can lead to misdiagnosis of patients, for example, a high signal in the anterior abdomen region may be mistaken for an enhancing peritoneal tumor. A torso coil is often also used for cardiac imaging. For torso and cardiac SENSE imaging, the sensitivity encoding needs to be in both the left-right and anterior-posterior directions (i.e., the x and y directions). The capability of performing SENSE imaging in the superior-inferior direction (i.e., the head-feet or the z-direction) is also desirable.

Known coil arrangements, and specifically, a birdcage transmit and receive "whole-body" coil of many MRI scanners, can be used to image a patient's abdomen and pelvis with good image homogeneity. However, a major disadvantage of using a "whole-body" coil as a receive coil is that the SNR is too low. The low SNR of a "whole-body" coil is caused by a low filling factor and also by the noise/unwanted signals from the tissue outside the region-of-interest (ROI). The filling factor of a RF coil is determined by the ratio of the volume of the sample (e.g., a human patient's body) being imaged to the effective imaging volume of the coil. The closer the filling factor of a RF coil to unity the better SNR of the coil. Usually, a "whole-body" coil has an effective imaging volume much larger than the volume of the body portion of a patient being imaged. Thus, a "whole-body" coil typically covers a much larger FOV (e.g., about 48 cm) than the body portion of interest to be imaged (e.g., 30 cm for the torso imaging). This causes the "whole-body" coil to couple to more noise and unwanted signals from the tissue outside the ROI and results in a lower SNR. In addition, a "whole-body" coil cannot be used for SENSE imaging.

Known array coils also allow imaging of a large field-of-view (FOV) while maintaining the SNR characteristic of a small and conformal coil. For example, a four-element "C-shaped" adjustable volume array coil is known and that improves the SNR for volume imaging. The mechanical housing of the "C-shaped" volume array coil is divided into two parts: anterior and posterior. Electrically, the "C-shaped" volume array coil consists of four loop coils: three loop coils in the anterior housing and one loop coil in the posterior housing. Each loop coil is critically coupled to its adjacent coil or coils to minimize the inductive coupling between the two adjacent coils and hence to reduce the noise correlation caused by the "cross-talk" between them. However, the four-element "C-shaped" volume array coil cannot provide uniform coverage over the entire axial direction of the torso (i.e., the cross-section of the torso) because it covers only about one half (i.e., the body portion inside the "c-shaped" coil) of the area of the torso cross-section.

It is also known that the direction of the magnetic field generated by a butterfly coil (or saddle coil) can be perpendicular to that generated by a loop coil. Thus, by using a pair of butterfly and loop coils, quadrature detection of a magnetic resonant signal can be achieved. Coil quadrature RF coil systems using this arrangement, including quadrature RF coil systems for neck/c-spine imaging and peripheral vascular imaging are known. The neck/c-spine RF coils typically include two quadrature coil pairs that are placed on the anterior and posterior of the imaging volume (e.g., the neck), respectively. Each of the quadrature coil pairs is formed by a loop coil and a split loop coil and is symmetric about the middle line of the coil. In known peripheral vascular RF coils, three butterfly-loop quadrature pairs are provided. Each of the butterfly-loop quadrature pair includes a large butterfly coil and smaller loop coil positioned at the middle of the butterfly coil. The loop coils are placed under the patient and the flexible wings of the butterfly coils are wrapped around the patient. Because the flexible RF coil system is wrapped around the patient, its filling factor is optimized (i.e., close to unity).

However, the quadrature neck/c-spine coil cannot perform effective SENSE imaging for the entire volume-of-interest (VOI), but only for the middle of the VOI. Further, each of the coil elements of this neck/c-spine coil has left-right symmetry (i.e., symmetric about the middle line of the coil) and also cover more than one-half of the VOI such that the distinctiveness of the complex sensitivity of the coil elements is not sufficient (except for the middle of the VOI) to perform SENSE imaging, particularly in the left-right direction. The peripheral vascular flexible RF coil system provides a much higher signal at the posterior region of the torso than that at the anterior region because the main coil section (i.e., the loop coil and about one half the butterfly coil) is under the patient and only the wings of the large butterfly coil are wrapped around the patient to cover the anterior region. Thus, the signal homogeneity of this flexible coil system in the axial direction is not acceptable for body imaging. Therefore, use of the flexible coil system is limited, for example, used as a vascular coil. In addition, the coil elements of this flexible coil system also only have left-right symmetry and do not distribute in the anterior-posterior direction. Thus, the flexible coil system cannot be used to perform SENSE imaging in both the left-right and anterior-posterior directions.

Further, these know coil arrangements (e.g., four-element 'C-shaped' coil, neck/c-spine coil, and peripheral vascular coil) are not dedicated SENSE coils. When used for SENSE imaging, these coils will generate higher geometrical noise (i.e., higher g-factor). Some known RF array coils are optimized for SENSE imaging of the torso and cardiac. For example, a known body coil includes four elliptic shaped loop elements: two on the flexible top and the other two at the bottom. There is no overlap between the adjacent coil elements. The "cross-talk" among the coil elements is minimized by using high input impedance preamplifiers. A known cardiac coil includes four rectangular coil elements, two on the top and the other two at the bottom, and two circular coil elements placed at the left and right, respectively. The two circular lateral coils are also tilted, for example, by 10°, for optimizing performance of SENSE imaging. High input impedance preamplifiers are used to reduce the inductive coupling among the coil elements having no overlap between adjacent coil elements. These optimized torso-SENSE and cardiac-SENSE coils, when being used for SENSE imaging, can provide a much lower geometrical noise than do the conventional torso and cardiac array coils.

However, the torso-SENSE coil and cardiac-SENSE coil are two-dimensional (2D) SENSE coils because the elements of the coils are arranged in the x and y directions. Thus, these coils can only perform SENSE imaging in the left-right direction (x-direction) and the anterior-posterior direction (y-direction) but not in the head-feet direction (z-direction). In order to perform SENSE imaging in the z-direction, coil elements also have to be arranged in the z-direction. Coils, including torso-SENSE imaging coils are also known for sensitivity encoding in all three directions, for example, a torso array coil with eight QD-surface coils for parallel imaging and a cardiac-SENSE imaging array. The three-dimensional (3D) torso-SENSE coil includes eight quadrature coil pairs: four for the anterior section and the other four for the posterior section. Each quadrature coil pair is formed by one rectangular loop coil and one 8-figure coil. Two quadrature coil pairs are arranged in all the x, y, and z directions, which allows the coil to perform SENSE imaging in the all three directions. This requires an eight channel imaging system for operation. The 3D cardiac-SENSE coil includes eight linear loop coils with the inductive coupling between adjacent coil elements distributed in the x-direction minimized by using transformers.

However, the torso-SENSE coil and the cardiac-SENSE coil do not operate satisfactorily as conventional RF coils because they have higher intrinsic noise (or lower intrinsic SNR). To achieve lower geometrical noise for SENSE imaging, a SENSE coil usually does not overlap the adjacent coil elements to critically decouple from each other, but uses high input (or low input) impedance preamplifiers to reduce the inductive coupling among the coil elements. This often results in insufficient isolation among the coil elements and hence higher intrinsic noise or lower intrinsic SNR.

Further, when used as conventional coils, SENSE coils cause image inhomogeneity. To achieve a higher reduction factor for SENSE imaging, the distinctiveness of the complex sensitivity profile of each of the coil elements of a SENSE coil is important. The distinctiveness of the complex sensitivity profile of each coil element of a SENSE coil is usually achieved by using smaller coil elements because of the strong local sensitivity profile. When the 3D torso-SENSE coil and the 3D cardiac-SENSE coil are used as conventional coils (e.g., for conventional imaging without intensity correction) image non-uniformity results. For these 3D SENSE coils, the anterior section needs to be far enough away from the posterior section to enable the coil elements of the two sections to isolate from each other. This can result in shading in the middle of the axial images obtained using these SENSE coils.

Thus, these known coil arrangements are configured such that limited discrimination between field patterns from the separate coil elements is provided. Therefore, when performing 3D parallel imaging, a separate channel is required for receiving signals from each of the coil elements, thus limiting the types of MRI systems capable of performing the 3D parallel imaging.

BRIEF DESCRIPTION OF THE INVENTION

In one exemplary embodiment, a coil for a medical imaging system is provided. The coil includes a first section and a second section. The first and second sections form a loop and are configured in a diagonal arrangement.

In another exemplary embodiment, a system for medical imaging is provided. The system includes a first coil configured in a diagonal arrangement and a second coil configured in a diagonal arrangement. The diagonal arrangement of the first coil is in a direction different than the diagonal arrangement of the second coil.

In yet another exemplary embodiment, a method for medical imaging is provided. The method includes configuring a first coil in a diagonal arrangement and configuring a second coil in a diagonal arrangement. The diagonal arrangement of the first coil is in a direction different than the diagonal arrangement of the second coil.

DETAILED DESCRIPTION OF THE INVENTION

Various exemplary embodiments of the present invention provide a multiple channel (e.g., multiple channels for use with multiple coil elements) RF array coil system that can be used as a conventional body coil and also as a SENSE coil in an MRI system. Sensitivity encoding in the three directions (i.e., x, y and z directions) is provided. Various exemplary embodiments also allow more than two coil elements to cover the same volume-of-interest (VOI) simultaneously to improve the SNR of the image. Coupling of adjacent coil elements to provide isolation without using high/low input impedance preamplifiers is also provided.

Imaging that is less affected by the positioning of patients (e.g., patients of different sizes and shapes) within coil elements is provided.

Figure 1:
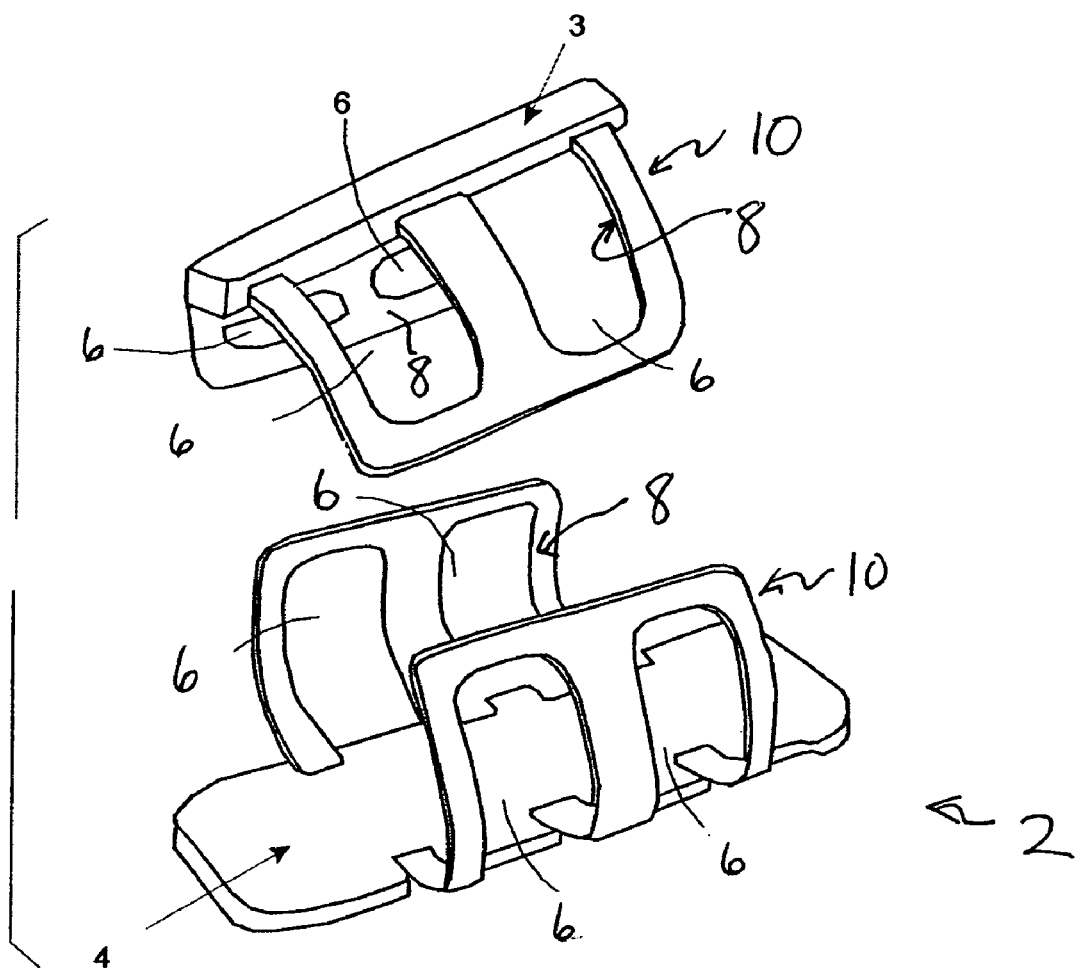
FIG. 1 is a perspective view of a diagonal-arranged quadrature MRI RF array coil system in accordance with an exemplary embodiment of the present invention.

Various exemplary embodiments of the present invention provide coil elements, which may be configured as coil arrays, for use in connection with MRI systems. In particular, a coil arrangement constructed according to one exemplary embodiment of the present invention is shown in FIG. 1. As shown therein, a diagonal-arranged quadrature MRI RF array coil system 2 generally includes two sections or portions: a flexible anterior coil section 3 and a flexible posterior coil section 4. The two flexible coil sections 3 and 4 may be wrapped around, for example, the torso/pelvis of a human patient to allow the array coil system 2 to conform to various body profiles of patients. Each of the flexible coil sections 3 and 4 include four windows or openings 6 on both the anterior and posterior coils (also referred to as an open design). The inner surfaces 8 of both the flexible coil sections 3 and 4 may be covered with pads for patient comfort. Further, the arms/wings 10 of the coil sections 3 and 4 may be molded with foam that makes the arms/wings 10 more flexible, which, for example, adds to patient comfort.

Figure 2:
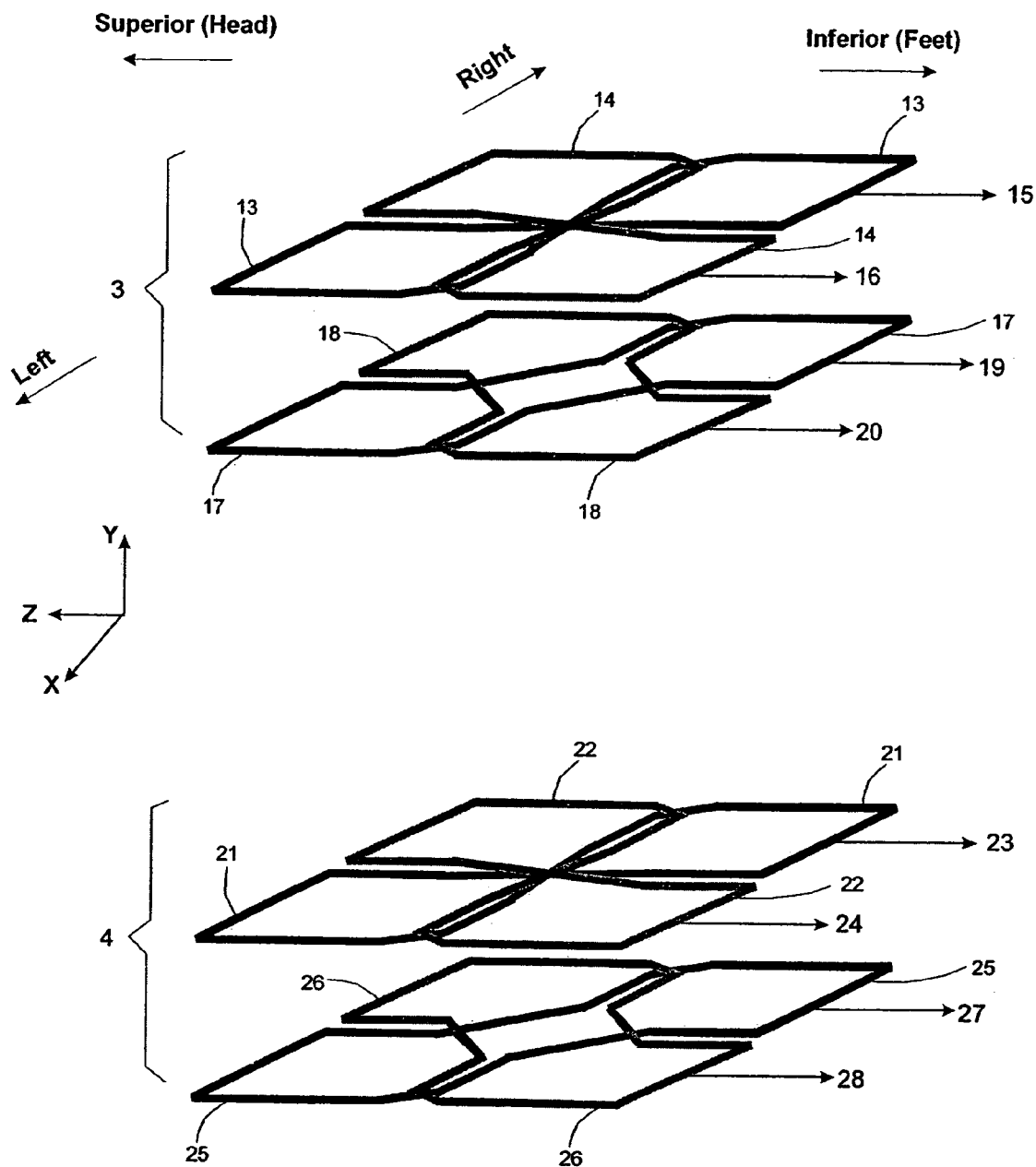
FIG. 2 is a schematic diagram of a diagonal-arranged quadrature MRI RF array coil system in accordance with an exemplary embodiment of the present invention.

FIG. 2 illustrates an exemplary embodiment of a coil arrangement 12 (e.g., electrical coil arrangement) of the array coil system 2. The coil arrangement 12 generally includes eight linear coil elements: four loop coils, including loop coil one 17, loop coil two 18, loop coil three 25, and loop coil four 26 and four saddle coils, including saddle coil one 13, saddle coil two 14, saddle coil three 21, and saddle coil four 22. It should be noted that different and/or additional types of coil elements may be used as desired or needed, including, but not limited to butterfly, A-shaped or other surface or volume coils. Each coil element forms one channel such that the array coil system 2 includes eight channels 15, 16, 19, 20, 23, 24, 27 and 28. The coil arrangement 12 forms four quadrature pairs: quadrature pair one (formed by saddle coil one 13 and loop coil one 17) and quadrature pair two (saddle coil two 14 and loop coil two 18) for the anterior section 3; and quadrature pair three (saddle coil three 21 and loop coil three 25) and quadrature pair four (saddle coil four 22 and loop coil four 26) for the posterior section 4.

Figure 3:
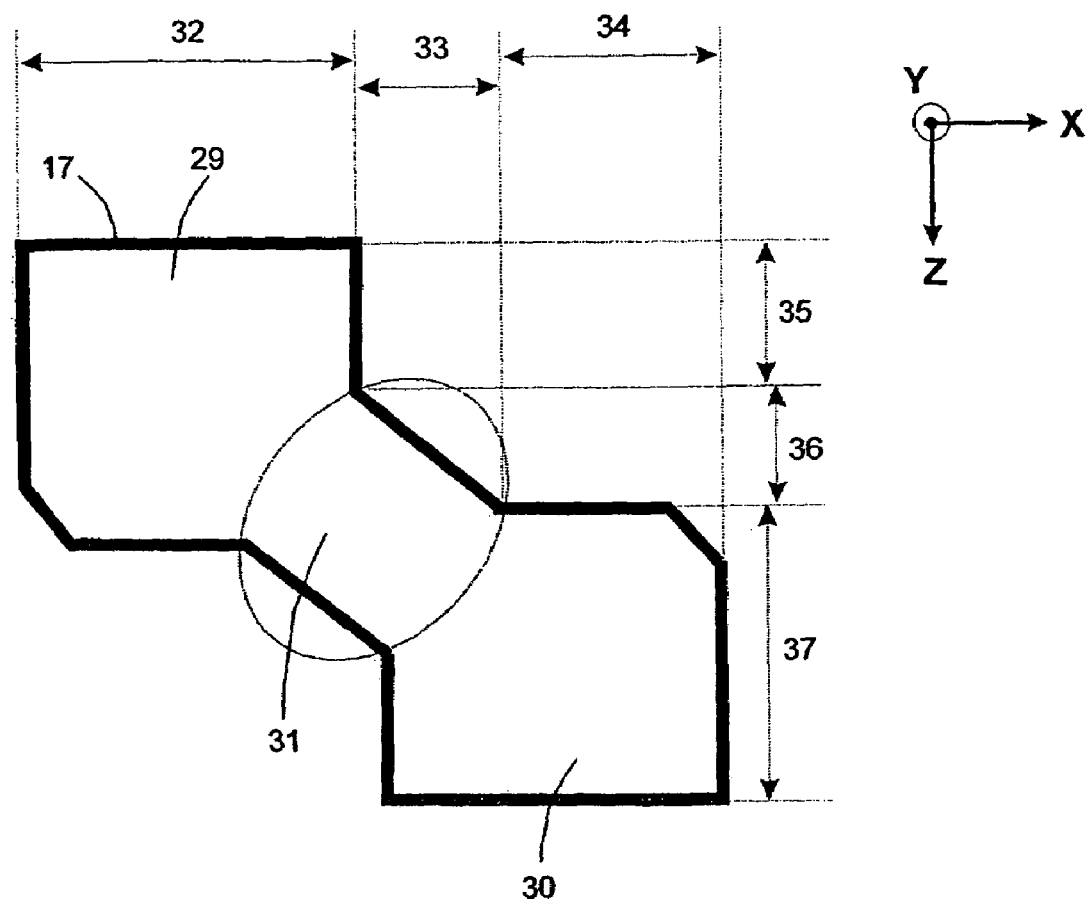
FIG. 3 is a plan view of a diagonal-arranged loop coil of a diagonal-arranged quadrature MRI RF array coil system in accordance with an exemplary embodiment of the present invention.
Figure 4:
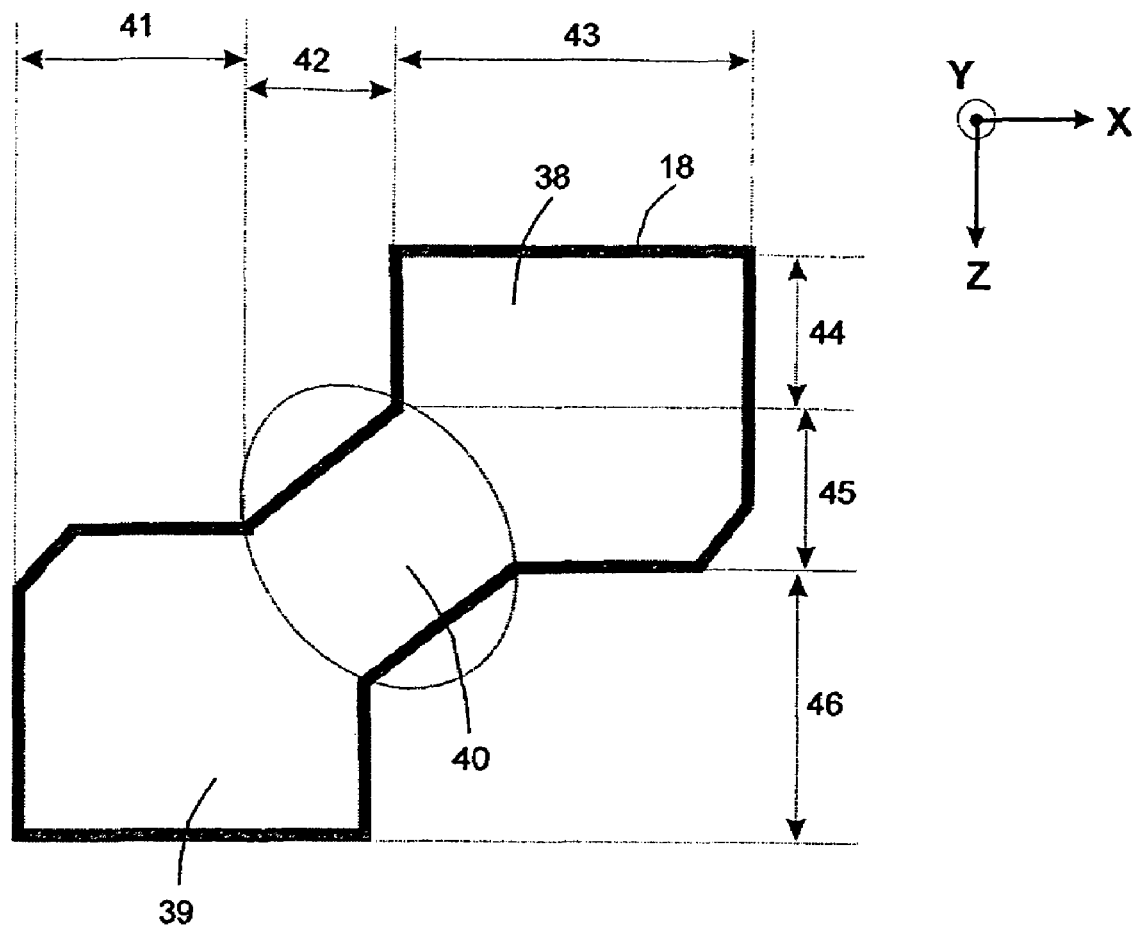
FIG. 4 is a plan view of another diagonal-arranged loop coil of a diagonal-arranged quadrature MRI RF array coil system in accordance with an exemplary embodiment of the present invention.
Figure 7:
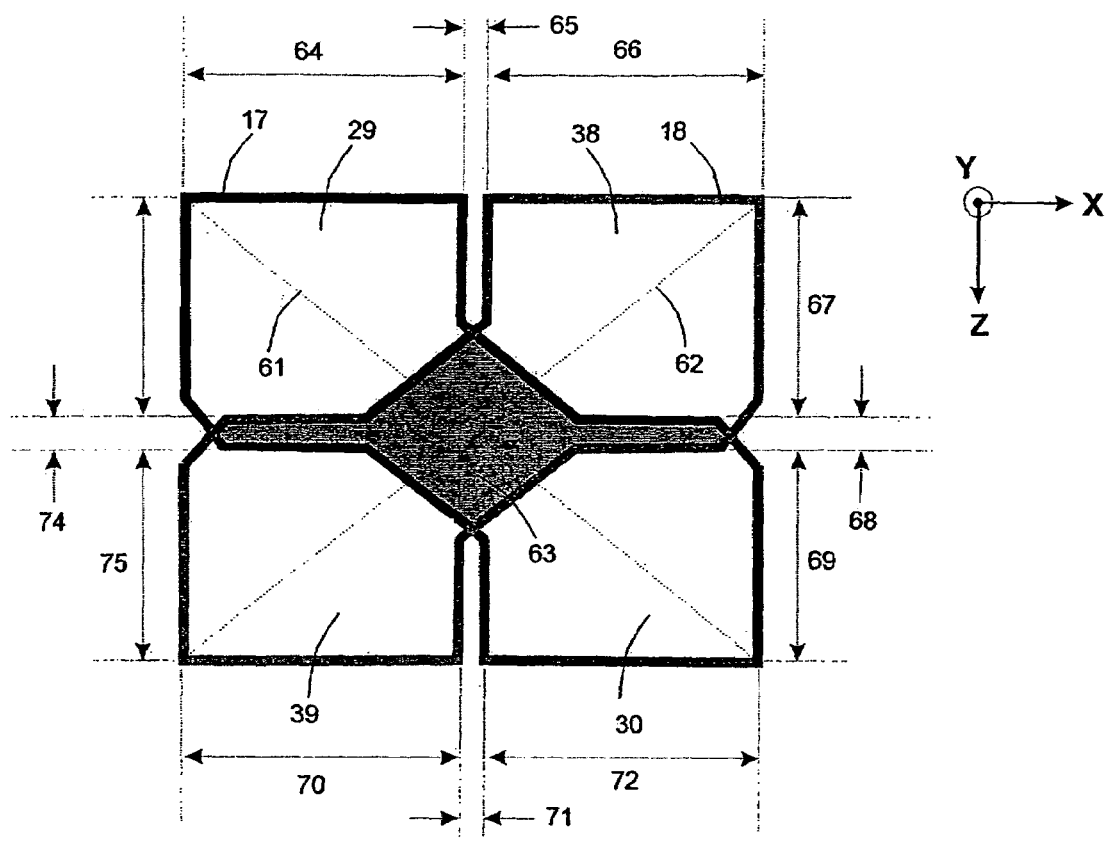
FIG. 7 is a plan view of a diagonal-arranged loop coil pair of a diagonal-arranged quadrature MRI RF array coil system in accordance with an exemplary embodiment of the present invention.

Each loop coil, as shown in an exemplary embodiment in FIG. 3 for loop coil one 17 and in an exemplary embodiment in FIG. 4 for loop coil two 18, may be divided into three sections: an upper loop section (upper loop section 29 for loop coil one 17 and upper loop section 38 for loop coil two 18), a lower loop section (lower loop section 30 for loop coil one 17 and lower loop section 39 for loop coil two 18) and a middle section (middle section 31 for loop coil one 17 and middle section 40 for loop coil two 18). The upper, middle and lower sections of loop coil one 17 are arranged in a diagonal direction 61, as shown in FIG. 7, and the upper, middle and lower sections of loop coil two 18 are arranged in a diagonal direction 62.

Figure 5:
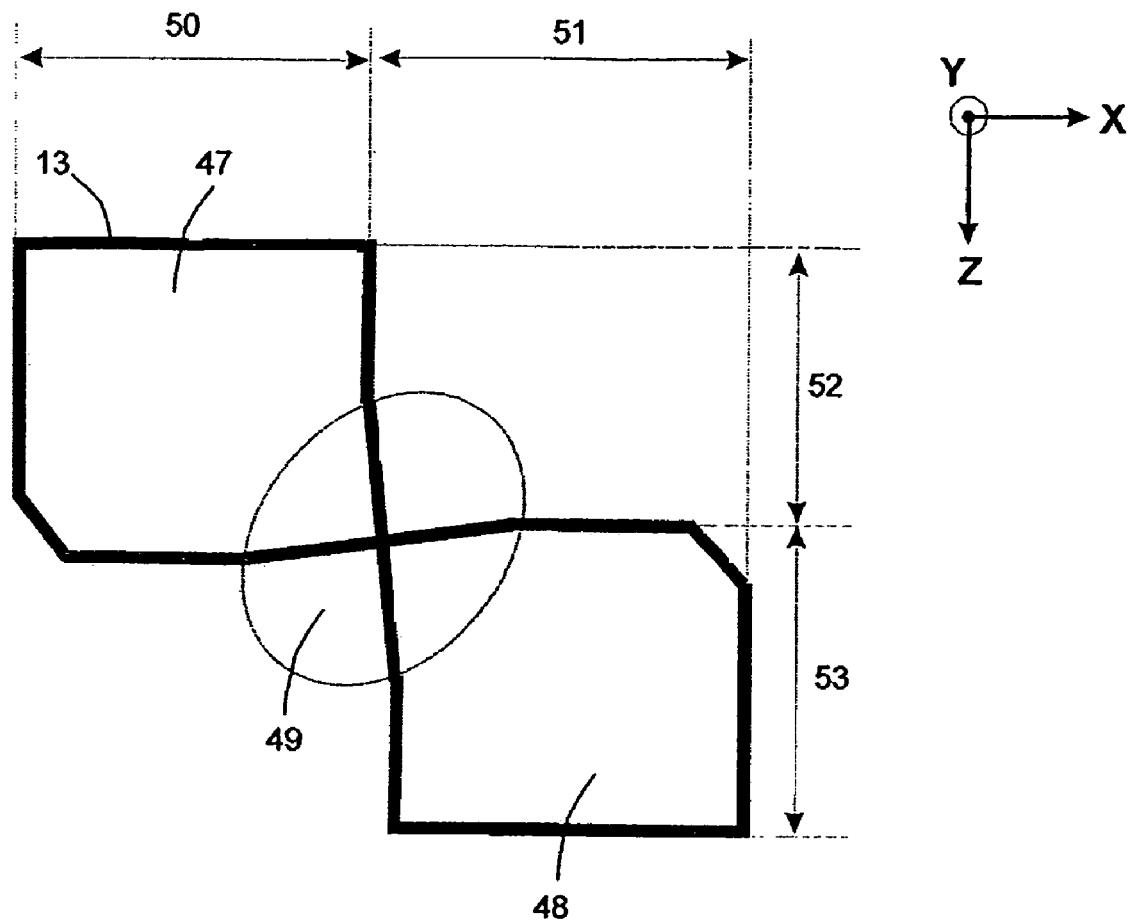
FIG. 5 is a plan view of a diagonal-arranged saddle coil of a diagonal-arranged quadrature MRI RF array coil system in accordance with an exemplary embodiment of the present invention.
Figure 6:
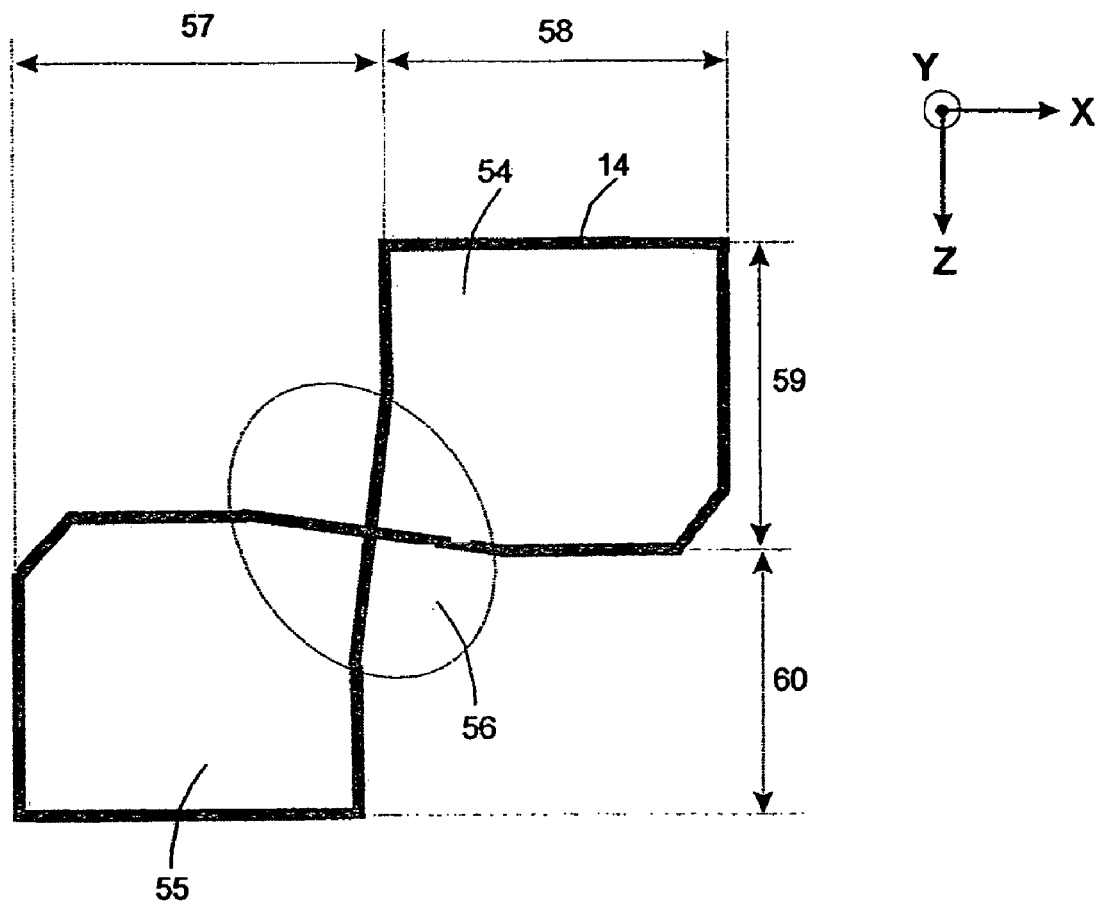
FIG. 6 is a plan view of another diagonal-arranged saddle coil of a diagonal-arranged quadrature MRI RF array coil system in accordance with an exemplary embodiment of the present invention.
Figure 8:
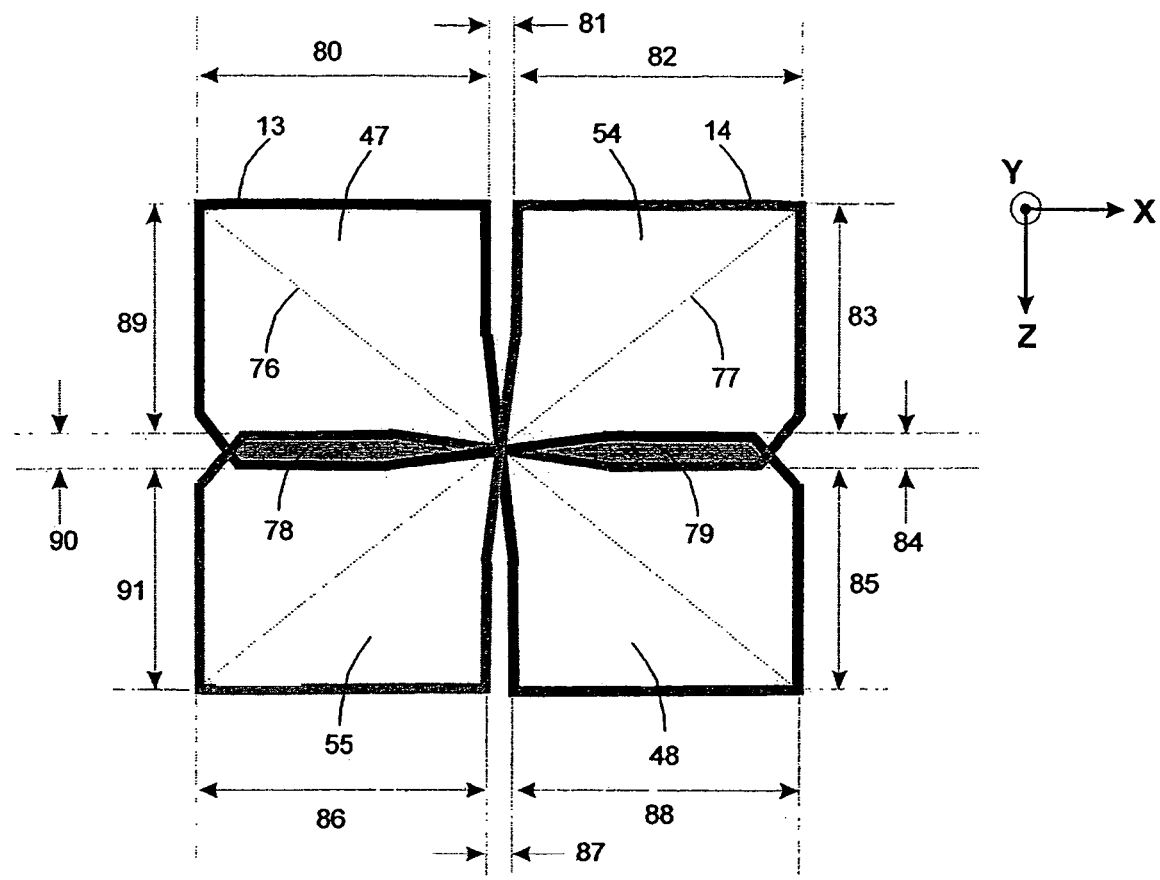
FIG. 8 is a plan view of a diagonal-arranged saddle coil pair of a diagonal-arranged quadrature MRI RF array coil system in accordance with an exemplary embodiment of the present invention.
Figure 9:
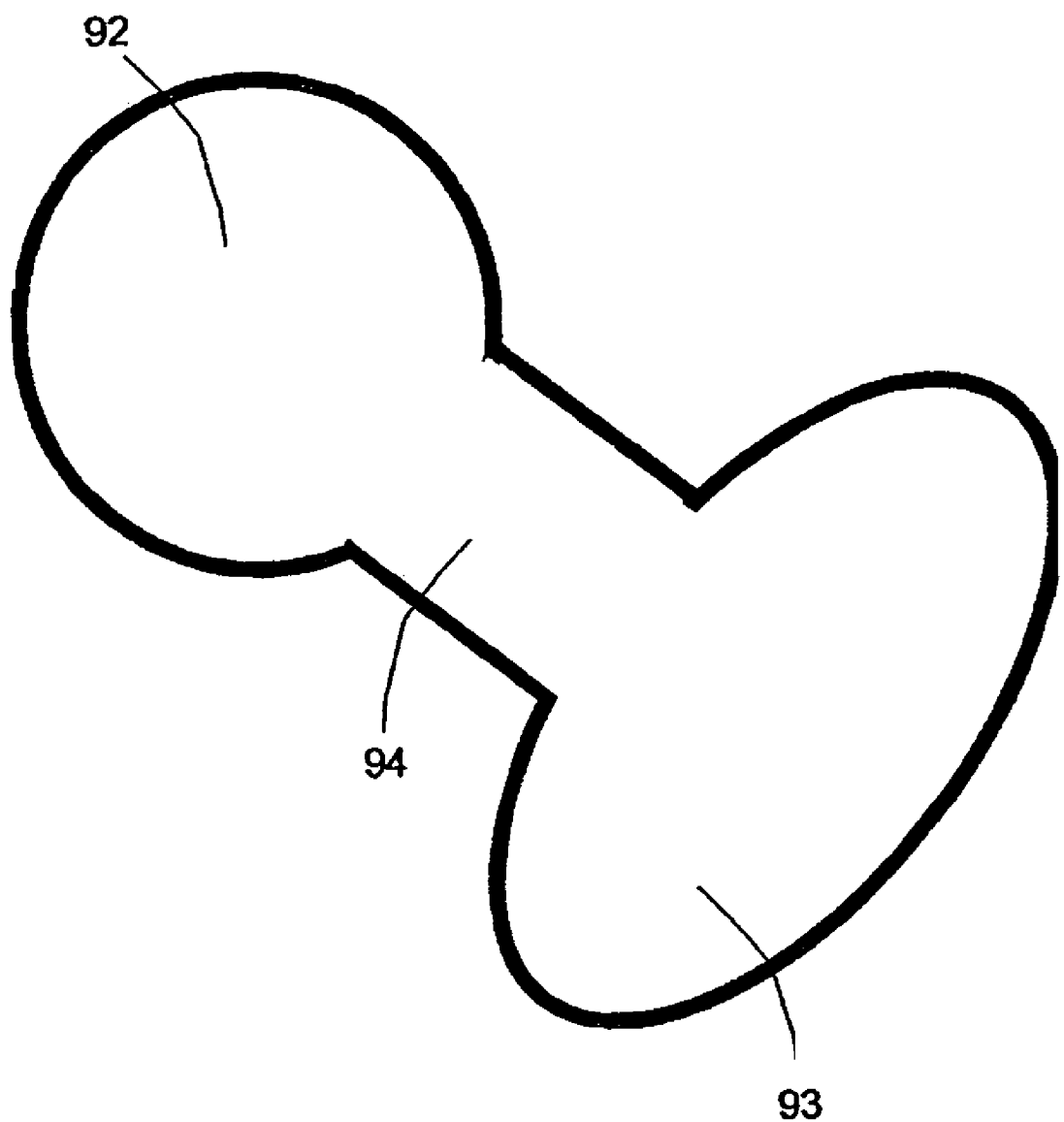
FIG. 9 is a plan view of another diagonal-arranged coil of a diagonal-arranged quadrature MRI RF array coil system in accordance with an exemplary embodiment of the present invention.
Figure 10:
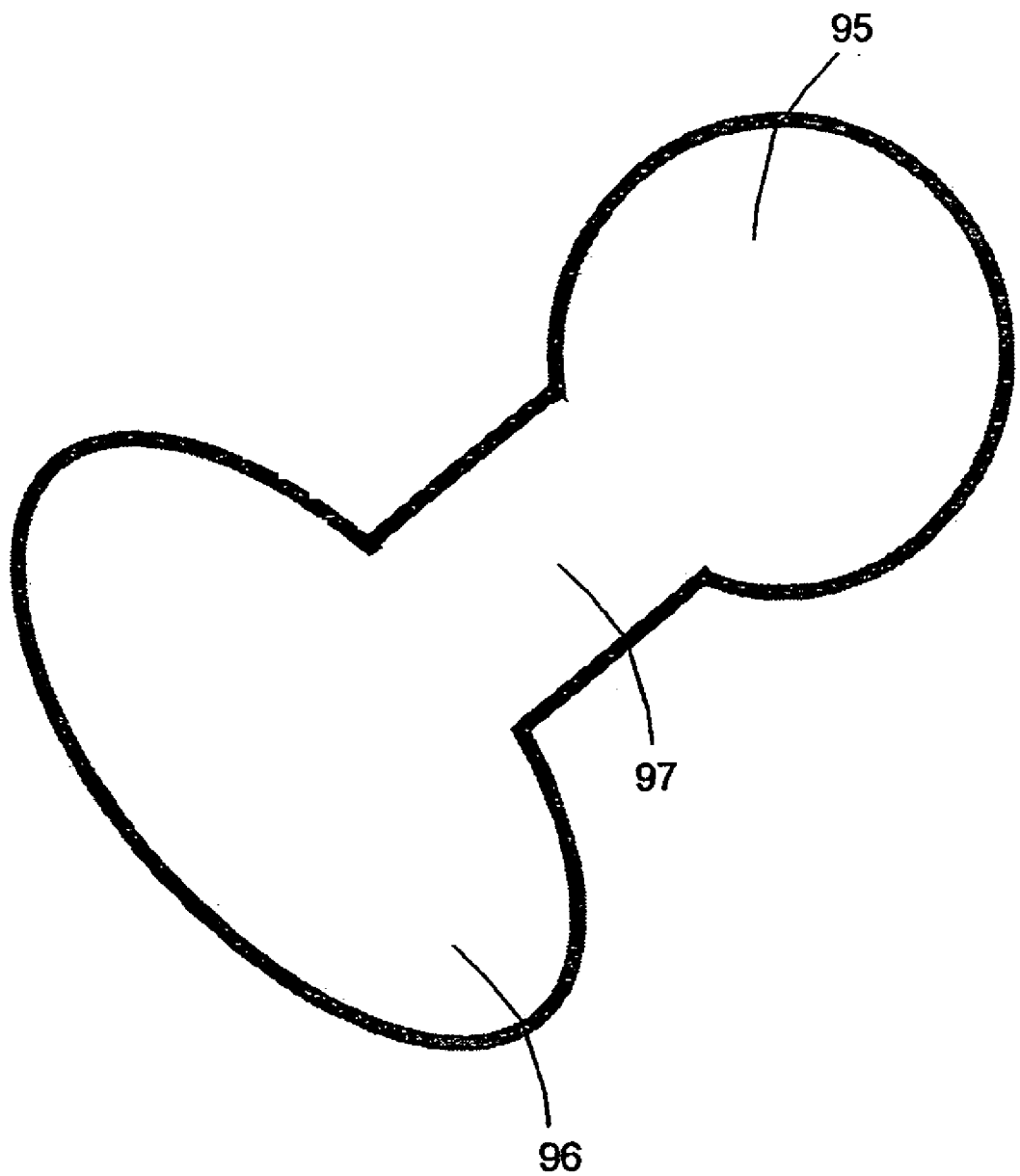
FIG. 10 is a plan view of another diagonal-arranged coil of a diagonal-arranged quadrature MRI RF array coil system in accordance with an exemplary embodiment of the present invention.
Figure 11:
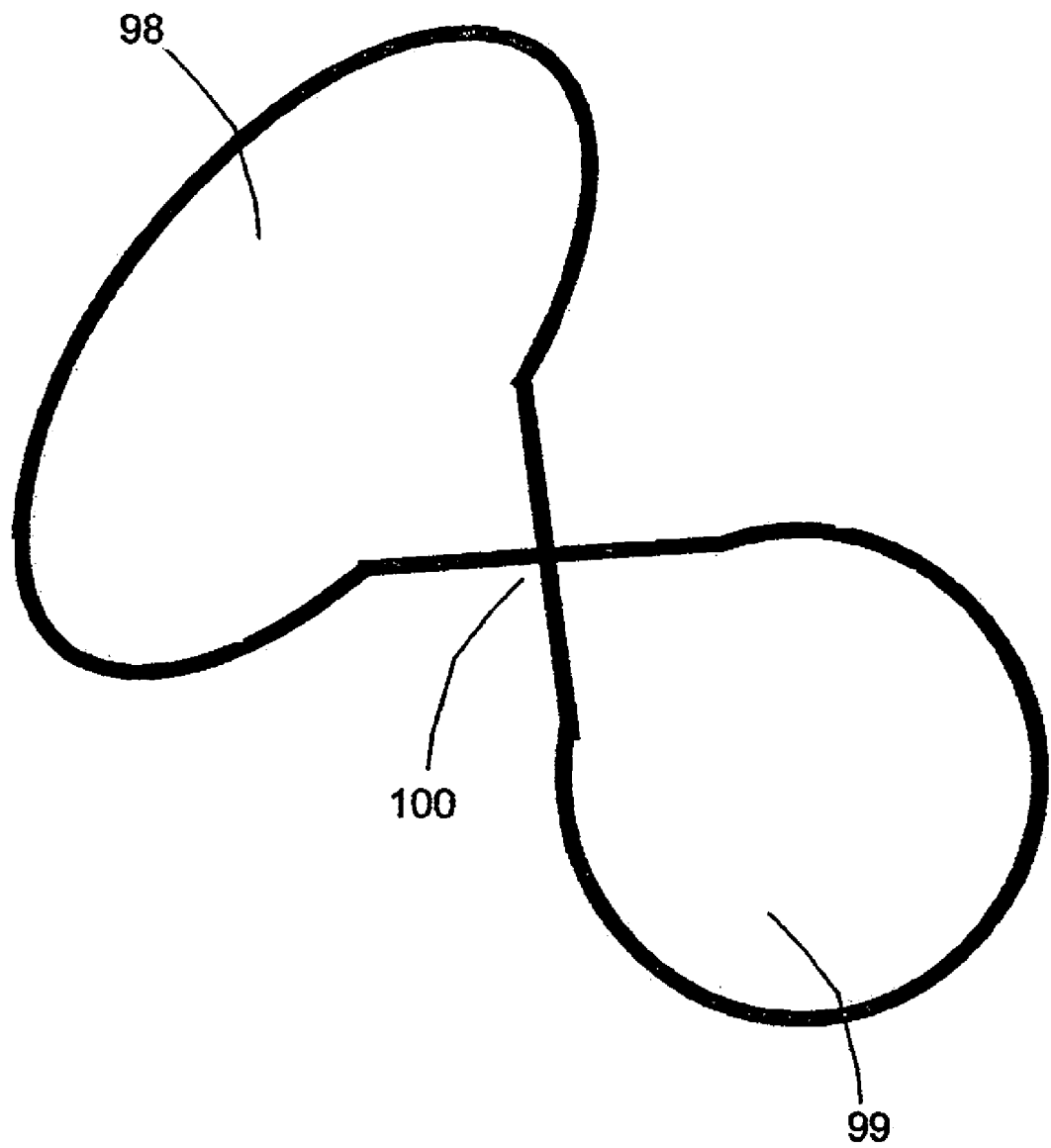
FIG. 11 is a plan view of another diagonal-arranged coil of a diagonal-arranged quadrature MRI RF array coil system in accordance with an exemplary embodiment of the present invention.
Figure 12:
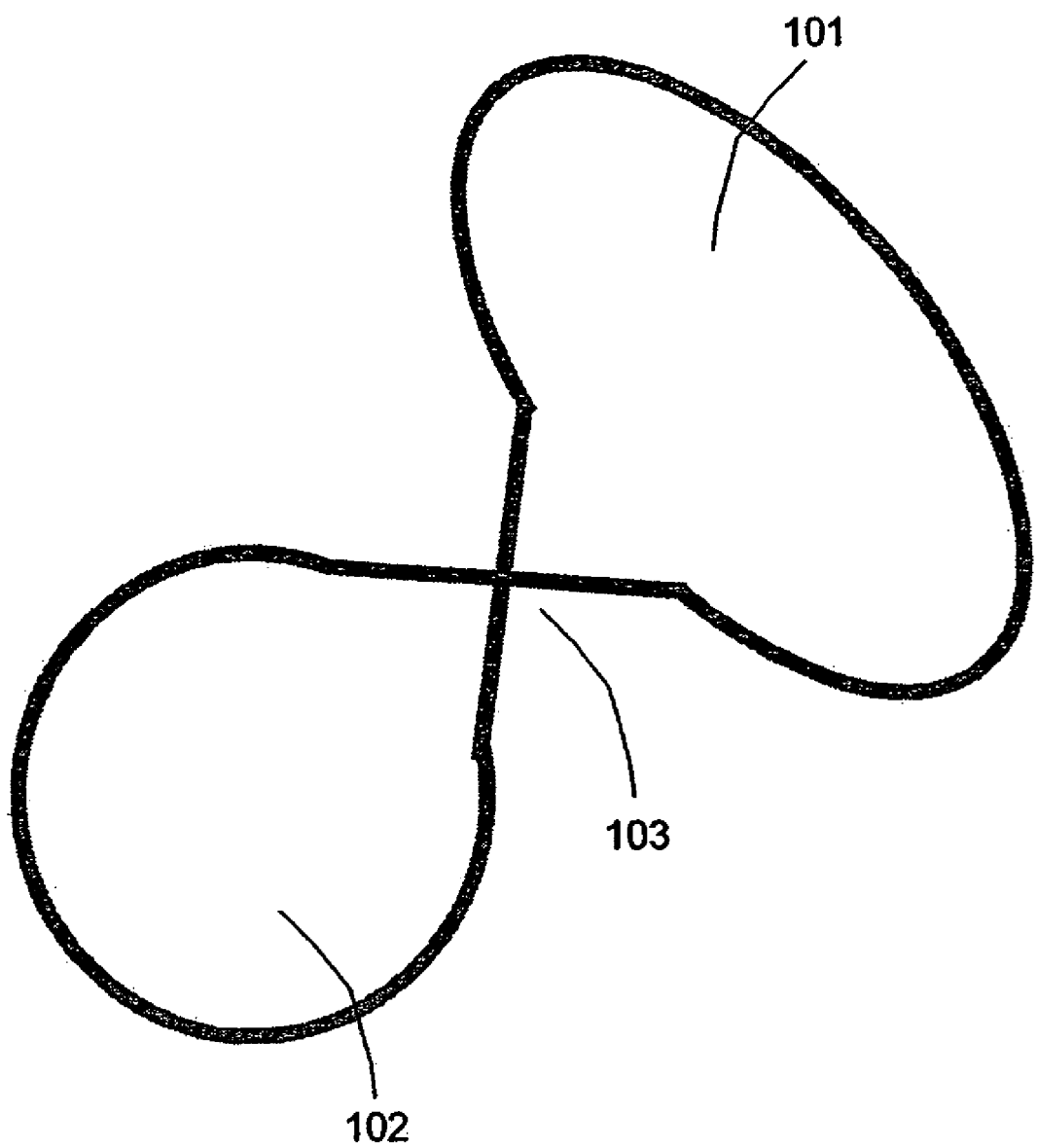
FIG. 12 is a plan view of another diagonal-arranged coil of a diagonal-arranged quadrature MRI RF array coil system in accordance with an exemplary embodiment of the present invention.

Similarly, each of the saddle coils, as shown in an exemplary embodiment in FIG. 5 for saddle coil one 13 and in an exemplary embodiment in FIG. 6 for saddle coil two 14, also may be divided into three sections: an upper loop section (upper loop section 47 for saddle coil one 13 and upper loop section 54 for saddle coil two 14), a lower loop section (lower loop section 48 for saddle coil one 13 and lower loop section 55 for saddle coil two 14) and a middle section (middle section 49 for saddle coil one 13 and middle section 56 for saddle coil two 14). The upper, middle and lower sections of saddle coil one 13 are arranged in a diagonal direction 76, as shown in FIG. 8, and the upper, middle and lower sections of saddle coil two 14 are arranged in the a diagonal direction 77. The diagonal lines of the loop and saddle coils (i.e., diagonal directions 61 and 76 or 62 and 77), may or may not coincide with each other.

The dimensions for the loop coil one 17 (i.e., the anterior coil) are defined in FIG. 3 as upper loop section x-dimension 32, middle loop section x-dimension 33, and lower loop section x-dimension 34; and upper loop section z-dimension 35, middle loop section z-dimension 36, and lower loop section z-dimension 37. The dimensions for loop coil two 18 (i.e., anterior coil) are defined in FIG. 4 as upper loop section x-dimension 41, middle loop section x-dimension 42 and lower loop section x-dimension 43; and upper loop section z-dimension 44, middle loop section z-dimension 45, and lower loop section z-dimension 46. The dimensions for saddle coil one 13 are defined in FIG. 5 as upper loop section x-dimension 50 and lower loop section x-dimension 51; and upper loop section z-dimension 52 and lower loop section z-dimension 53. The dimensions for saddle coil two 14 are defined in FIG. 6 as upper loop section x-dimension 57 and lower loop section x-dimension 58; and upper loop section z-dimension 59 and lower loop section z-dimension 60. The length of each side of the composite coil of loop coil one 17 and loop coil two 18 is defined in FIG. 7 as lengths 64, 65 and 66 for the superior side, lengths 70, 71 and 72 for the inferior side, lengths 73, 74 and 75 for the left side and lengths 67, 68 and 69 for the right side. The length of the four sides of the composite coil of saddle coil one 13 and saddle coil two 14 are defined in FIG. 8 as lengths 80, 81 and 82 for the superior side, lengths 86, 87 and 88 for the inferior side, lengths 89, 90 and 91 for the left side and lengths 83, 84 and 85 for the right side.

For the array coil system 2, the method of minimizing the mutual inductance of the two adjacent loop coils, for example, loop coil one 17 and loop coil two 18 is different from the conventional manner of critical coupling of the two adjacent RF coils (e.g., by overlapping at the region of their edges). In various embodiments of the present invention, the two adjacent loop coils of the array coil system 2, for example, loop coil one 17 and loop coil two 18, are overlapped at the middle section 63 of the two coils as shown in FIG. 7. The coupling between the two adjacent saddle coils, for example, saddle coil one 13 and saddle coil two 14, is not as strong because the magnetic field created by each of the two saddle coils is closer to quadrature (i.e., perpendicular to each other). Thus, as shown in FIG. 8, overlapping occurs at sections 78 and 79 to achieve isolation between the two saddle coils.

It should be noted that the isolation between the loop coils of the anterior and posterior sections and the isolation between the saddle coils of the anterior and posterior sections depends on numerous factors, including, but not limited to the load, for example, the patient body, between the two sections. It should further be noted that in operation, the loop coils are essentially decoupled from the saddle coils as a result of the quadrature nature of the magnetic field produced by these two kinds of coils.

The inner edges of loop coil one 17 and loop coil two 18, along the z-direction, are separated by a gap defined by length 65 for the superior section and a gap defined by length 71 for the inferior section, except for the middle section, as shown in FIG. 7. Similarly, the inner edges of saddle coil one 13 and saddle coil two 14, along the z-direction, are also separated by a gap defined by length 81 for the superior section and gap defined by length 87 for the inferior section as shown in FIG. 8. In one exemplary embodiment, the gap is between about 0.5 cm and about 2.5 cm.

The shape and the size of the upper and lower loop sections of each coil element of the present invention may be modified as desired or needed (e.g., based upon the operating characteristics of the MRI system). FIGS. 9, 10, 11 and 12 show other exemplary embodiments to illustrate different configurations of the loop sections. However, as should be appreciated others are possible. As shown, the two loop coils have a circular upper loop section (upper loop section 92 for loop coil one shown in FIG. 9 and upper loop section 95 for loop coil two shown in FIG. 10) and an elliptical lower loop section (elliptical lower loop section 93 for loop coil one and elliptical lower loop section 96 for loop coil two), having different shapes and sizes. The two saddle coils have an elliptic upper loop section (elliptic upper loop section 98 for saddle coil one shown in FIG. 11 and elliptic upper loop section 101 for saddle coil two shown in FIG. 12) and a circular lower loop section (circular lower loop section 99 for saddle coil one and circular lower loop section 102 for saddle coil two), having different shapes and sizes. Each of the loop coils also have middle sections 94, 97, 100 and 103 as shown in FIGS. 9, 10, 11 and 12, respectively.

Figure 13:
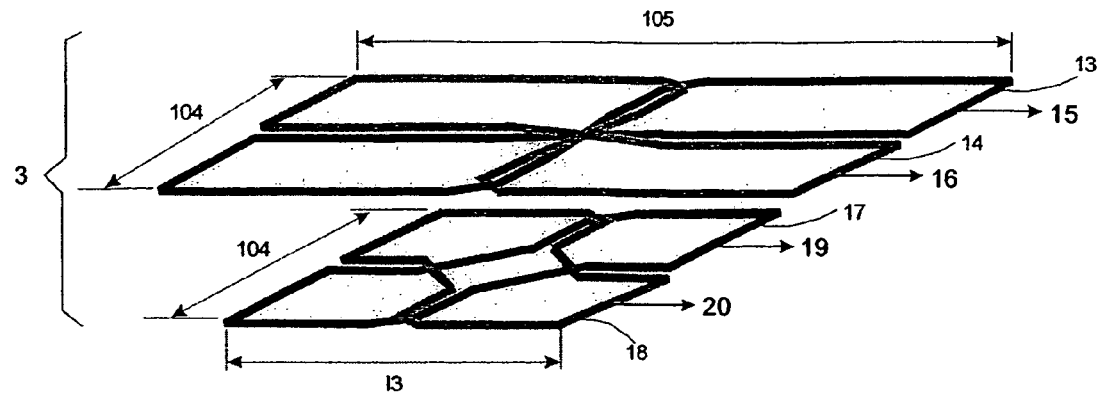
FIG. 13 is a schematic diagram of another diagonal-arranged quadrature MRI RF array coil system in accordance with an exemplary embodiment of the present invention.
Figure 13:
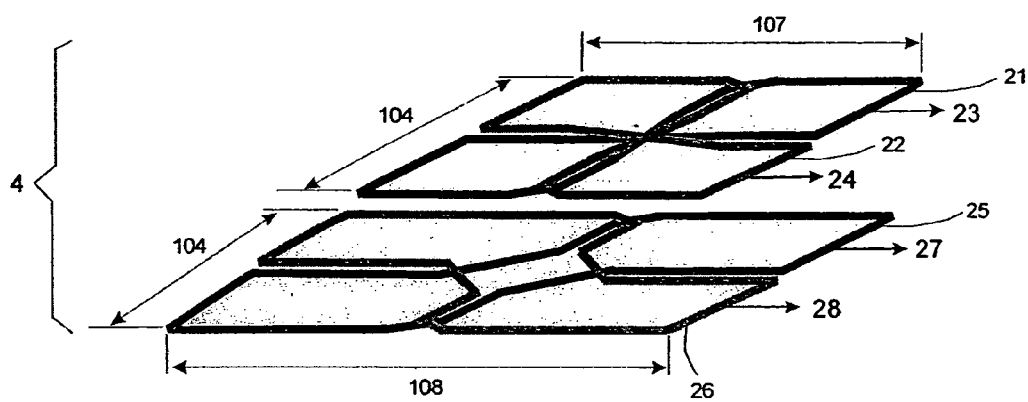

Merely for exemplary purposes, as shown in FIG. 13, the array coil system 2 has the dimensions defined therein for widths 105, 106, 107 and 108 in the x-direction and length 104 in the z-direction. In one exemplary embodiment that may be used, for example, for imaging the human torso or pelvis, the width 105 of the anterior saddle coils 13 and 14 is 62 centimeters (cm) and the width 106 of the anterior loop coils 17 and 18 is 38 cm. In this exemplary embodiment, the width 107 of the posterior saddle coils 21 and 22 is 42 cm and the width 108 of the posterior loop coils 25 and 26 is 48 cm. The length 104 of the anterior coil section 3 and posterior coil section 4 is 33 cm. In another exemplary embodiment that may be used, for example, for cardiac imaging, the width and the length of the anterior coil section are the same as those of the posterior coil section and equal to 35 cm for the widths 105, 106, 107 and 108 and 21 cm for the length 104, respectively.

Figure 14:
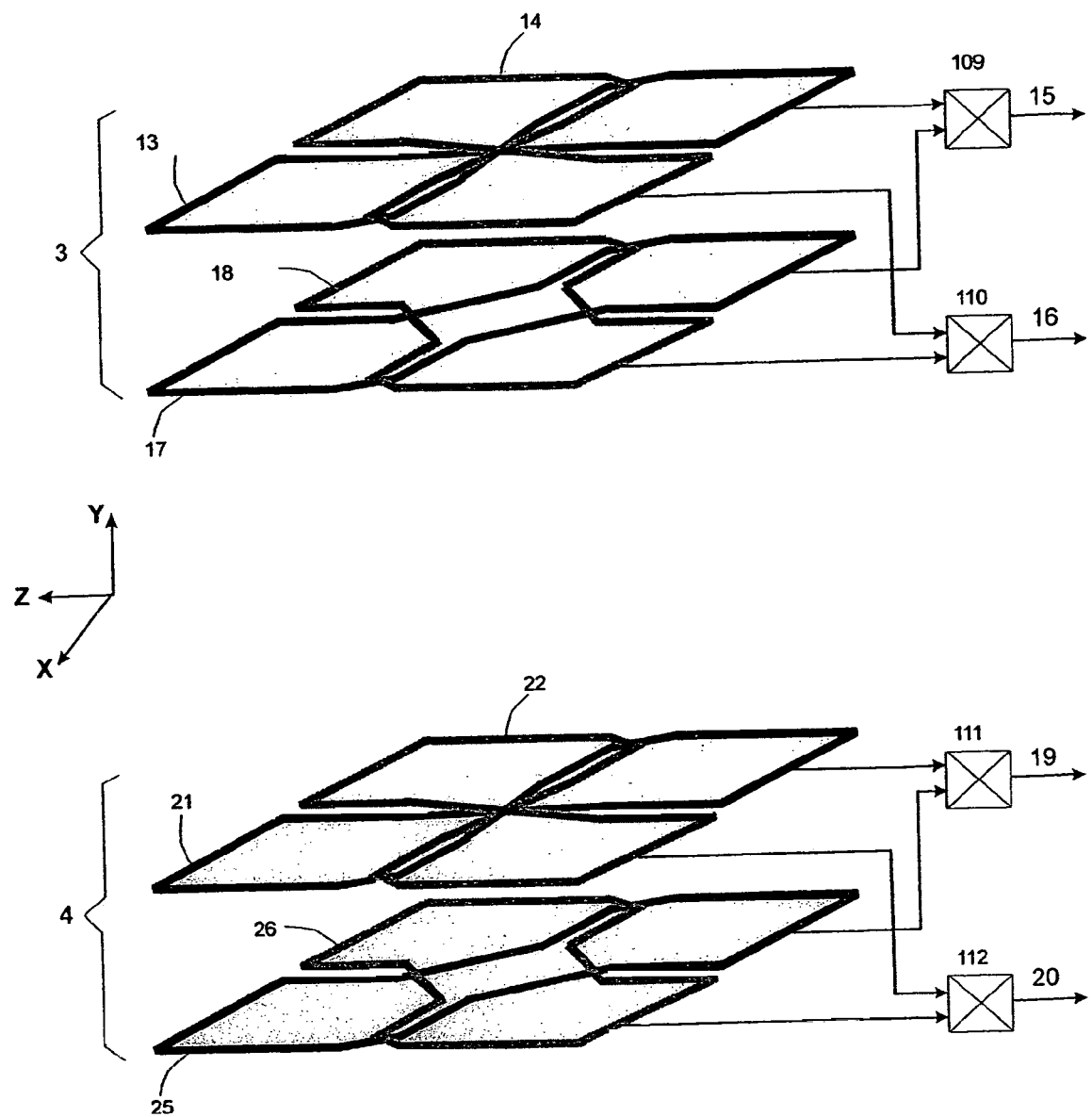
FIG. 14 is a schematic diagram of another diagonal-arranged quadrature MRI RF array coil system in accordance with an exemplary embodiment of the present invention.

The array coil system 2 may be implemented as an eight-channel system to be used in connection with an eight-channel MRI scanner. However, the array coil system 2 may be implemented as a four-channel system by combining some of the eight coil elements such that it may be used in connection with a four-channel MRI scanner. FIG. 14 illustrates one exemplary embodiment for combining the eight coil elements into four output channels using a quadrature combiner (i.e., 90° combiner) for each quadrature pair. Specifically, combiners 109 and 110 are used for the anterior coil section 3 and combiners 111 and 112 are used for the posterior coil section 4. Any suitable combiners may be used. Three-dimensional parallel imaging, for example, using four channels, thereby may be provided.

Figure 15:
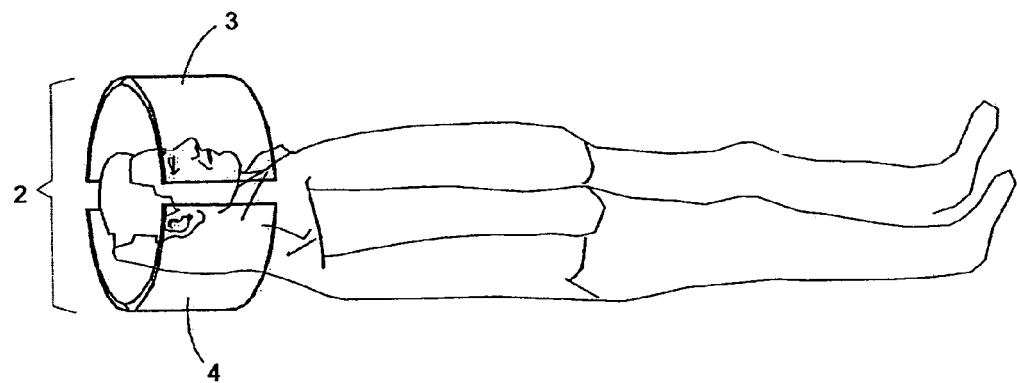
FIG. 15 is a perspective view of another diagonal-arranged quadrature MRI RF array coil system in accordance with an exemplary embodiment of the present invention.
Figure 16:
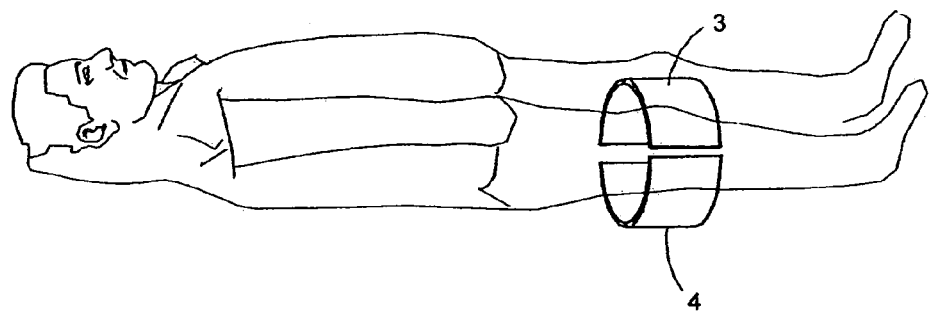
FIG. 16 is a perspective view of another diagonal-arranged quadrature MRI RF array coil system in accordance with an exemplary embodiment of the present invention.

It should be noted that the array coil system 2 is not limited to the embodiment shown in FIG. 1. For example, the array coil system 2 also may be constructed on rigid formers of different shapes for imaging different parts of a human body. FIGS. 15 and 16 illustrate two exemplary embodiments of constructing the array coil system 2 on a cylindrical former for conventional and 3D SENSE imaging of a head, as shown in FIG. 15 and a knee, as shown in FIG. 16, respectively.

Figure 17:
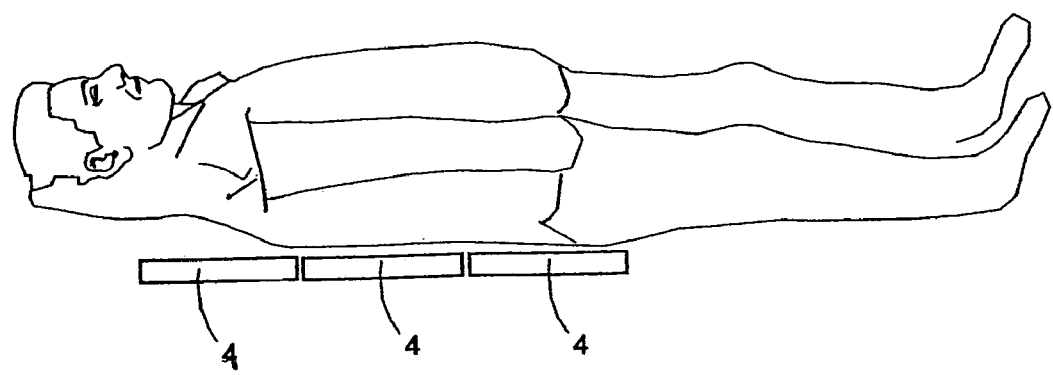
FIG. 17 is a perspective view of another diagonal-arranged quadrature MRI RF array coil system in accordance with an exemplary embodiment of the present invention.
Figure 18:
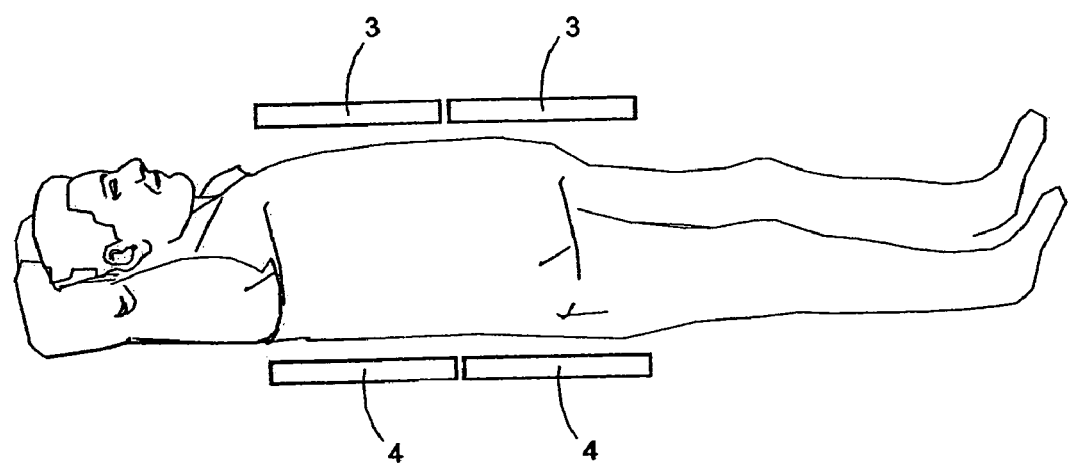
FIG. 18 is a perspective view of another diagonal-arranged quadrature MRI RF array coil system in accordance with an exemplary embodiment of the present invention.
Figure 19:
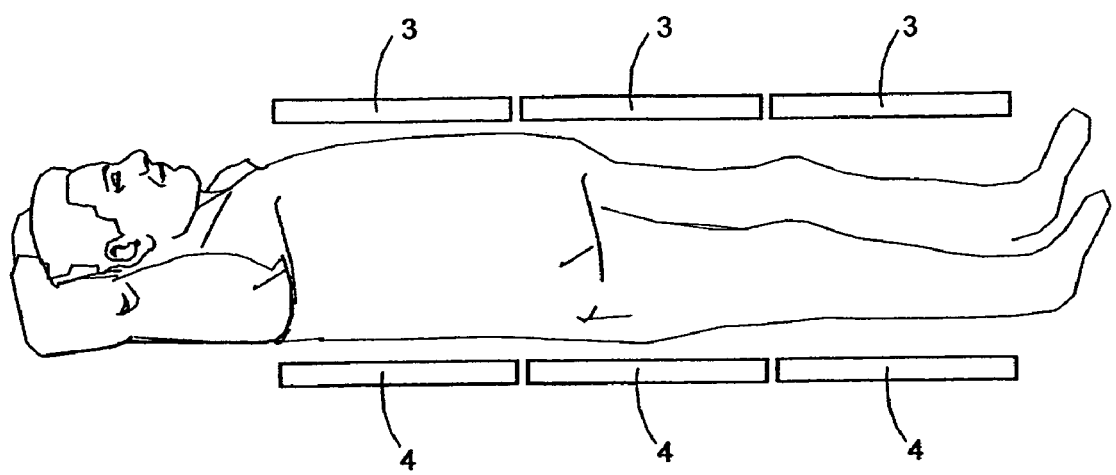
FIG. 19 is a perspective view of another diagonal-arranged quadrature MRI RF array coil system in accordance with an exemplary embodiment of the present invention.

Further, and for example, the posterior quadrature array coil system 4 may be used to construct a three station 2D SENSE cervical-thoracic-lumbar spine coil as shown in FIG. 17. As another example, the array coil system 2 also may be used to construct a multiple station RF coil system, such as a two station torso-pelvis coil, as shown in FIG. 18, and a three station peripheral vascular coil, as shown in FIG. 19, to perform 3D SENSE imaging with multiple consecutive scans without repositioning the patient between two adjacent scans.

The various embodiments of the present invention (e.g., flexible two-piece design) allows the array coil system 2 to accommodate various body profiles of patients. For example, and in one embodiment, the separate anterior-posterior, lightweight and open design make the array coil system 2 more user and patient friendly. The separate anterior and posterior sections facilitate the patient entrance and exit of the array coil system 2 and also allow an individual (e.g., a technologist) to transport each section separately. Further, the weight of the array coil system 2 is light so that it reduces the load of an individual transporting (e.g., carrying) the array coil system 2. Additionally, the multiple-window design makes the array coil system 2 lighter and also may be less claustrophobic for patients.

The filling factor of the array coil system 2 also is optimized (i.e., very close to unity). Therefore, the array coil system 2 provides improved SNR for both the torso/pelvis and cardiac imaging.

The anterior loop coils are isolated from the posterior saddle coils due to their quadrature nature (i.e., the magnetic field generated by the loop coil is perpendicular to that generated by the saddle coil) and also the load (i.e., the body of a patient is between the anterior loop and posterior saddle coils) and vice versa for the isolation between the anterior saddle coils and the posterior loop coils. Because the array coil system 2 is wrapped around, for example, a human body, the loading isolation effect is quite significant. This reduces restriction on the need of positioning the anterior coils exactly symmetric over the posterior coils for the purpose of quadrature isolation. Even if the coil positioning is not exact, for example, due to a slight tilting of the anterior coil and/or non-symmetric shape of the cross-section of a patient body, the anterior coils are still isolated from the posterior coils and the array coil system 2 can still generate uniform images. Therefore, the array coil system 2 is more robust for the patient positioning (e.g., more user friendly).

Further, the diagonal-arranged design as described herein makes SENSE imaging possible for all x, y and z directions. The various embodiments use both the magnitude and phase of the magnetic field generated by each coil element to create the distinctiveness for its complex sensitivity in all three directions or dimensions. The upper and lower loops of each coil element, for example, for SENSE imaging, function like two separated loop coils. The diagonal-arranged design allows the upper and lower loops of each coil element to be distributed along both the x and z directions in order to achieve SENSE imaging in these two directions in the region where the two adjacent coil elements are separated by a gap. At the central region, the distinctiveness of the complex sensitivity of each coil element is mainly provided by the phase difference between the loop and saddle coils in both the x and z directions. The anterior and posterior two-piece design further distributes the coil elements in the y direction and enables SENSE imaging to be performed in this direction, however, the various embodiments are not limited to a two-piece design. Therefore, the array coil system 2 may provide a 3D SENSE coil.

Additionally, overlapping, for example, loop coil one 17 and loop coil two 18 at their central region not only allows the two loop coils to be critically decoupled from each other, but also allows both of the loop coils to cover the central region at the same time. Similarly, the two saddle coils 13 and 14 can be critically decoupled from each other and at the same time used to cover the central region by overlapping the two anterior coil saddle coils 13 and 14 at the central region. Essentially, the central region is covered by all the eight coil elements of the array system 2 (i.e., four from the anterior section 3 and the other four from the posterior section 4). Therefore, the array coil system 2 can provide improved SNR at the central region.

The wider anterior saddle coils 13 and 14 and posterior loop coils 25 and 27, as shown in FIG. 13, provide a uniform signal sensitivity profile over the entire cross-section of the volume being imaged. The wider anterior saddle coils 13 and 14 and posterior loop coils 25 and 27 can overlap at the left and right sides of a human body to provide improved coverage at the left and right regions of the body and improved homogeneity of the axial image of the array coil system 2.

Each of the coil elements of the array coil system 2 is isolated from its adjacent coil elements by critical coupling, quadrature isolation or loading isolation as described herein. There is no need to use low/high impedance preamplifiers to achieve the isolation between two coil elements of the array coil system 2. Preamplifiers may be used as a secondary method to further reduce the mutual inductance between coil elements of the array system 2.

By combining each quadrature pair using a quadrature combiner as described herein, an eight-element coil system can be implemented in connection with a four-channel coil system, as shown in FIG. 14, such that it can be used, for example, on a four-channel MRI scanner. This four-channel coil system has improved field homogeneity for the axial images. This four-channel coil system also can provide improved SNR and perform SENSE imaging in all three directions/dimensions like an eight-channel coil system.

Therefore, the array coil system may operate similar to a conventional coil and a 3D SENSE coil, and may be used on either an eight-channel or four-channel MRI scanner.

The diagonal-arranged coil elements of the array coil system 2 also can be used to construct multiple-channel and multiple-station RF coil systems, for example, a two station torso-pelvis coil, a three station peripheral vascular coil, and/or a three station cervical-thoracic-lumbar spine coil. These multiple-channel and multiple-station RF coil systems perform 3D SENSE imaging with multiple consecutive scans without repositioning the patient between two adjacent scans.

While the invention has been described in terms of various specific embodiments, those skilled in the art will recognize that the invention can be practiced with modification within the spirit and scope of the claims.

What is claimed is:

1. A system for medical imaging comprising:
a first coil configured in a diagonal arrangement;
a second coil configured in a diagonal arrangement, the diagonal arrangement of the first coil in a direction different than the diagonal arrangement of the second coil; and
at least third and fourth coils configured in a diagonal arrangement, the diagonal arrangement of the third coil in a direction different than the diagonal arrangement of the fourth coil, and wherein the coils are arranged in one of a (i) superior-inferior direction, (ii) left-right direction and (iii) anterior-posterior direction, and configured for operation in at least one of conventional and sensitivity encoding (SENSE) imaging.

2. A system in accordance with claim 1 wherein at least one of the first and second coils comprise at least one of a loop coil, butterfly coil and a saddle coil.

3. A system in accordance with claim 1 wherein the first and second coils are configured to overlap at a middle section.

4. A system in accordance with claim 3 wherein each of the first and second coils comprise an upper and lower section, and wherein inner edges of the upper and lower sections are separated by a gap of about one-half centimeter to about two and one-half centimeters along a main magnetic field direction.

5. A system in accordance with claim 1, wherein the are coils configured to provide quadrature operation.

6. A system in accordance with claim 5 wherein the coils are configured to operate in connection with separate channels of a medical imaging system.

7. A system in accordance with claim 5 wherein the coils are configured for combining to operate in connection with a medical imaging system.

8. A system in accordance with claim 7 wherein the medical imaging system comprises a magnetic resonance imaging (MRI) system and wherein the coils are configured to operate in connection with two channels of the MRI system.

9. A system in accordance with claim 5 further comprising at least one combiner for quadrature combining at least two of the coils.

10. A system in accordance with claim 1 wherein at least two of the coils forming at least one of an anterior and posterior section are flexible.

11. A system in accordance with claim 1 further comprising fifth and sixth coils configured in a diagonal arrangement, the diagonal arrangement of the fifth coil in a direction different than the diagonal arrangement of the sixth coil, wherein the coils are configured as quadrature pairs.

12. A system in accordance with claim 11 wherein the quadrature pairs are arranged in one of a (i) superior-inferior direction, (ii) left-right direction and (iii) anterior-posterior direction.

13. A system for medical imaging comprising:
a first coil configured in a diagonal arrangement;
a second coil configured in a diagonal arrangement, the diagonal arrangement of the first coil in a direction different than the diagonal arrangement of the second coil; and
at least third and fourth coils configured in a diagonal arrangement, the diagonal arrangement of the third coil in a direction different than the diagonal arrangement of the fourth coil, wherein the coils are arranged in one of a (i) superior-inferior direction, (ii) left-right direction and (iii) anterior-posterior direction, and wherein anterior saddle coils are configured wider than anterior loop coils and posterior loop coils are configured wider than posterior saddle coils.

14. A system in accordance with claim 13 wherein at least one of the first and second coils comprise at least one of a loop coil, butterfly coil and a saddle coil.

15. A system in accordance with claim 13 wherein the first and second coils are configured to overlap at a middle section.

16. A system in accordance with claim 15 wherein each of the first and second coils comprise an upper and lower section, and wherein inner edges of the upper and lower sections are separated by a gap of about one-half centimeter to about two and one-half centimeters along a main magnetic field direction.

17. A system in accordance with claim 13 wherein the coils are configured to provide quadrature operation.

18. A system for medical imaging comprising:
a first coil configured in a diagonal arrangement;
a second coil configured in a diagonal arrangement, the diagonal arrangement of the first coil in a direction different than the diagonal arrangement of the second coil; and
at least third and fourth coils configured in a diagonal arrangement, the diagonal arrangement of the third coil in a direction different than the diagonal arrangement of the fourth coil, wherein the coils are arranged in one of a (i) superior-inferior direction, (ii) left-right direction and (iii) anterior-posterior direction, and wherein anterior saddle coils are configured wider than anterior loop coils and posterior loop coils are configured wider than posterior saddle coils and the anterior saddle coils overlap the posterior loop coils on left and right sides.

19. A system in accordance with claim 18 wherein at least one of the first and second coils comprise at least one of a loop coil, butterfly coil and a saddle coil.

20. A system in accordance with claim 18 wherein the first and second coils are configured to overlap at a middle section.

21. A system in accordance with claim 20 wherein each of the first and second coils comprise an upper and lower section, and wherein inner edges of the upper and lower sections are separated by a gap of about one-half centimeter to about two and one-half centimeters along a main magnetic field direction.

22. A system in accordance with claim 18 wherein the coils are configured to provide quadrature operation.

* * * * *